United States Patent [19]

Kapoor

[11] Patent Number: 4,762,801

[45] Date of Patent: Aug. 9, 1988

[54] METHOD OF FABRICATING POLYCRYSTALLINE SILICON RESISTORS HAVING DESIRED TEMPERATURE COEFFICIENTS

[75] Inventor: Ashok K. Kapoor, Palo Alto, Calif.

[73] Assignee: National Semiconductor Corporation, Santa Clara, Calif.

[21] Appl. No.: 17,388

[22] Filed: Feb. 20, 1987

[51] Int. Cl.[4] .......................................... H01L 21/265
[52] U.S. Cl. ........................ 437/024; 148/DIG. 136;
437/918; 437/27; 437/247; 357/59
[58] Field of Search ................. 29/571, 576 B, 576 C,
29/577 C, 610 R; 148/1.5, DIG. 61, DIG. 136;
357/59 B; 437/27, 24, 918, 247

[56] References Cited

U.S. PATENT DOCUMENTS

| 4,467,519 | 8/1984 | Glang et al. | 29/576 B |
| 4,579,600 | 4/1986 | Shah et al. | 29/576 B |
| 4,643,777 | 2/1987 | Maeda | 29/571 |

FOREIGN PATENT DOCUMENTS 155121 9/1984 Japan .

OTHER PUBLICATIONS

Ghandhi, *VLSI Fabrication Principles*, New York: John Wiley and Sons, Inc., 1983.
S. Prussin et al., "Formation of Amorphous Layers by Ion Implantation," *J. Appl. Phys.* (15 Jan. 1985) 57(2):180–185.

Primary Examiner—Brian E. Hearn
Assistant Examiner—Mary Wilczewski
Attorney, Agent, or Firm—Lee Patch; Mark Aaker; Robert C. Colwell

[57] ABSTRACT

A method of fabricating polycrystalline silicon resistors having nearly zero or positive temperature coefficient includes the steps of depositing a layer of polycrystalline silicon, implanting the layer with silicon to make the layer substantially amorphous, introducing an impurity to dope the layer, and annealing the layer.

15 Claims, 3 Drawing Sheets

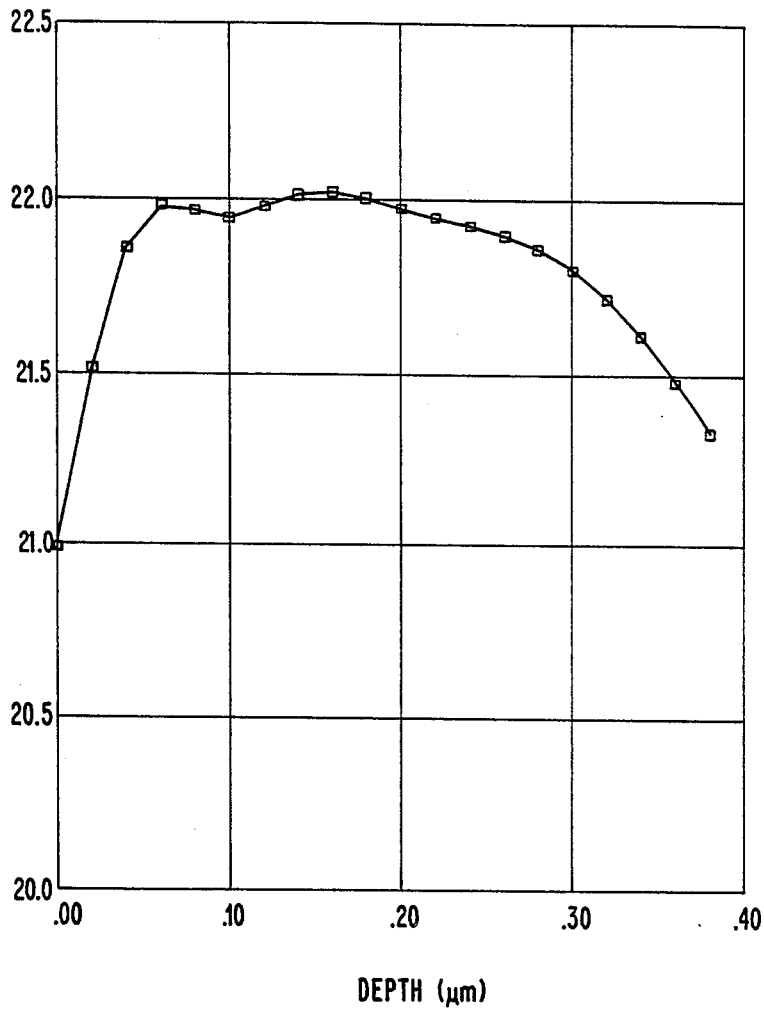
FIG._1.

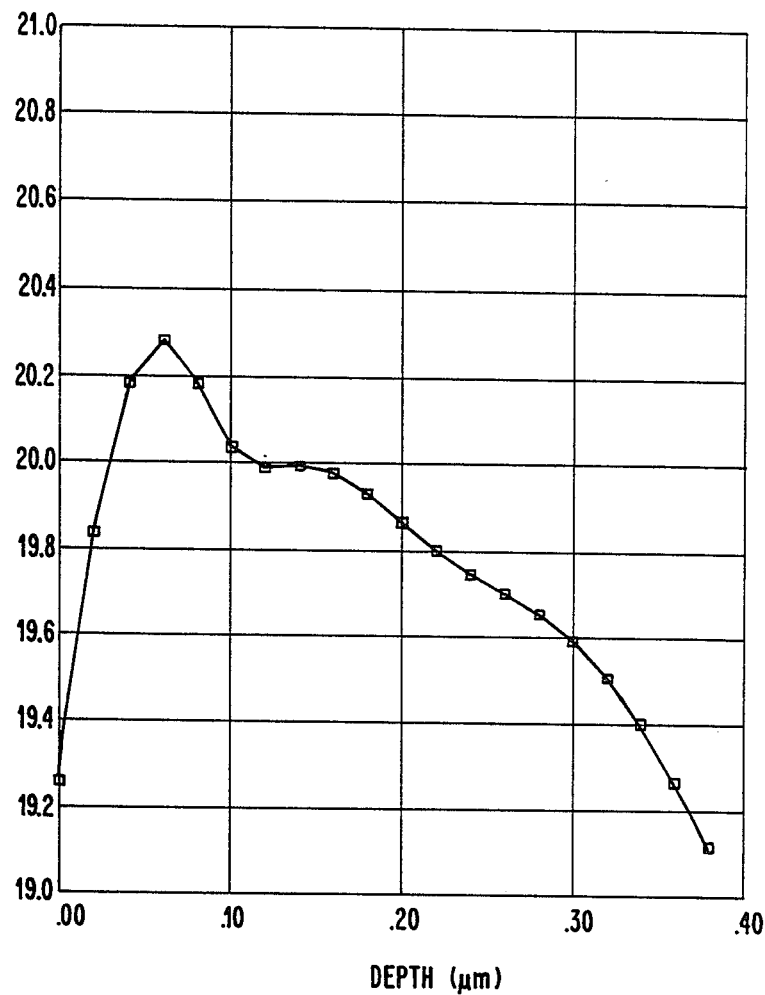
FIG._2.

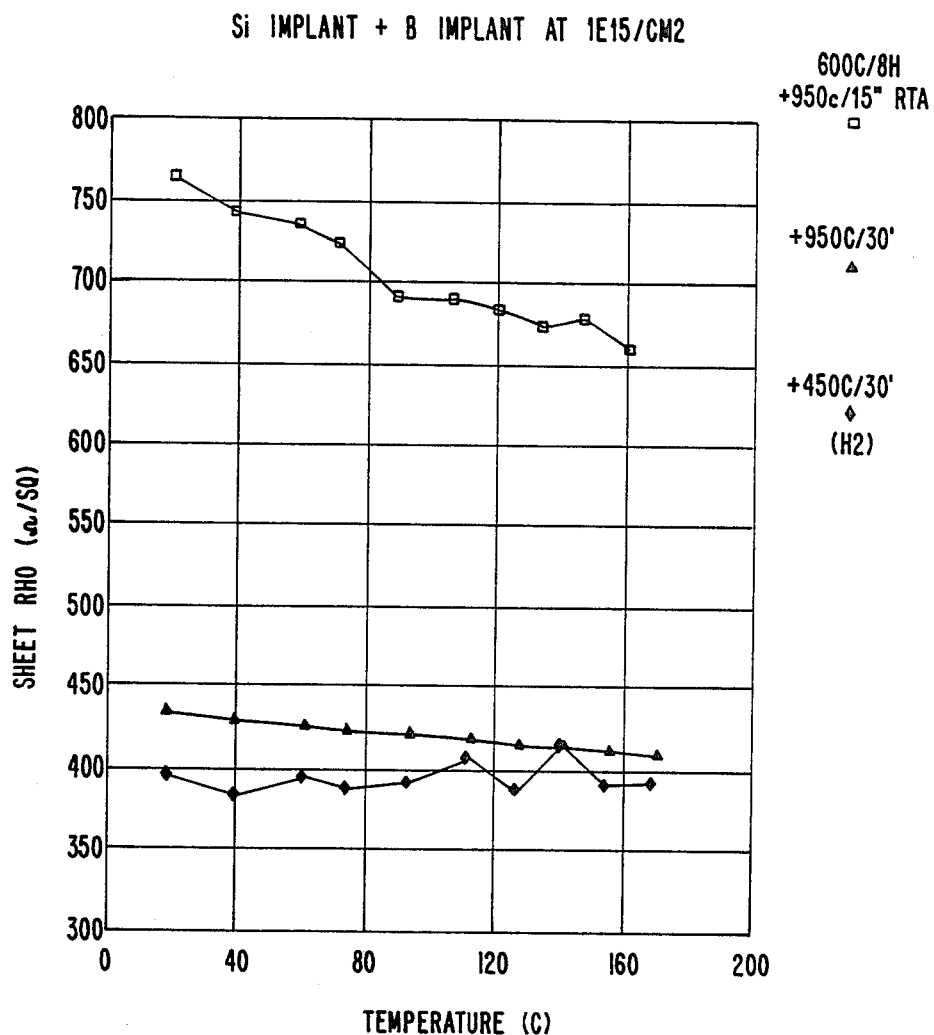
FIG._3.

METHOD OF FABRICATING POLYCRYSTALLINE SILICON RESISTORS HAVING DESIRED TEMPERATURE COEFFICIENTS

BACKGROUND OF THE INVENTION

1. Field of the Invention

This invention relates generally to semiconductor fabrication processes, and to processes for fabricating polycrystalline silicon resistors. More particularly, the invention relates to a method of fabricating polycrystalline silicon resistors having temperature coefficients which are nearly zero or even positive.

2. Description of the Prior Art

Semiconductor structures and integrated circuits are manufactured using a wide variety of well known techniques. In the manufacture of semiconductor devices or integrated circuits, active and passive components are formed, typically on a silicon substrate, and then interconnected in a desired manner.

Resistors in such structures typically are formed using one of two techniques. According to a first technique, regions of the semiconductor silicon substrate itself are doped with an impurity such as boron, phosphorus or arsenic, which impurity renders the doped regions conductive, but with a desired resistivity. By forming ohmic connections to a pair of spaced-apart locations in such regions, a "diffused" resistor is provided.

A second technique for fabricating resistors in semiconductor structures is to deposit a layer of polycrystalline silicon over the substrate, but separated therefrom by an insulating layer, and then lightly dope the polycrystalline silicon with a desired impurity to render it conductive to the desired extent. To complete the resistor, ohmic connections are formed to a pair of spaced apart regions on the polycrystalline silicon. Compared to diffused resistors, polysilicon resistors offer a significant advantage because the polycrystalline layer does not consume any area in the silicon or other semiconductor substrate. Thus, the silicon remains available for the fabrication of active components, while resistors interconnecting components may be formed directly above the components themselves. Additionally, because of the insulating layer which separates the resistors from the substrate, the polycrystalline silicon resistors have a substantially lower capacitance with the substrate than do diffused resistors.

Unfortunately, these advantages of polycrystalline silicon resistors are often offset by the undesirable negative temperature coefficient of such resistors. A negative temperature coefficient means that as temperature increases, the resistance of such resistors decreases. The negative temperature coefficient is undesirable because it may result in circuits which are thermally unstable. That is, because the resistors in the circuit conduct more current at higher temperatures, more current flows through the circuit and the circuit dissipates more power. The increased power dissipation results in a further rise in temperature, a further decline in resistance, which in turn causes additional current, higher power, and a still higher temperature. Because of this undesirable thermal characteristic, polycrystalline silicon resistors have not been employed in many circuits where their application otherwise would be ideal.

It is known that polycrystalline silicon resistors having a positive temperature coefficient may be fabricated by employing massive doses of impurity. Unfortunately, such massive doses greatly lower the resistance per unit area. As a result, to obtain high resistances, huge resistors are required. Such large resistors are undesirable, particularly as continuing advances in semiconductor fabrication technology result in the remainder of the circuit being smaller and smaller.

SUMMARY OF THE INVENTION

I have developed a technique for fabricating polycrystalline silicon resistirs which have approximately zero or slightly positive temperature coefficients, yet do not require large doses of impurity. Such resistors offer substantial advantages over the prior art polycrystalline silicon resistors. In particular, such resistors are thermally neutral, and thus may be employed in a wider variety of integrated circuits than prior art resistors.

In a preferred embodiment, a method of fabricating polycrystalline silicon resistors according to my invention includes the steps of depositing a layer of polycrystalline silicon on a semiconductor structure; implanting the polycrystalline silicon, preferably with silicon, to render the polycrystalline silicon substantially amorphous; and then introducing a desired impurity into the amorphous silicon. Once the silicon is doped, it is annealed to reestablish the grain structure within the silicon. By controlling the implantation, impurity doping, and annealing processes, the resulting resistiors will have temperature coefficients which are nearly zero or even positive.

BRIEF DESCRIPTION OF THE DRAWINGS

FIG. 1 is a graph illustrating the total damage dose of a silicon implant into a polycrystalline silicon layer.

FIG. 2 is a graph characterizing the number of silicon atoms implanted as a function of depth within the layer.

FIG. 3 is a graph which shows sheet resistance as a function of temperature after different annealing processes.

DETAILED DESCRIPTION OF THE PREFERRED EMBODIMENTS

In the fabrication of conventional polycrystalline silicon resistors, a polycrystalline silicon film is deposited across a silicon dioxide insulating layer and then doped with an impurity to provide the film with the desired resistivity. As a result of the process by which it is deposited, typically chemical vapor deposition, the polycrystalline silicon film will have grains generally of the same size. As presently understood, the negative temperature coefficient of such films arises from the fact that the carrier transport across the boundaries of the grains in the film is a thermally-activated process. The process becomes more efficient as temperature increases. By fabricating a polycrystalline silicon film having appropriate sized grains, the temperature coefficient may be changed to vary from a slightly negative value to nearly zero, and even to a positive value. I have developed such a process for fabricating such resistors.

In a preferred embodiment of my process, a polycrystalline silicon film about 3500 Angstroms thick is deposited, using chemical vapor deposition, onto a silicon dioxide layer on a semiconductor structure. Next, using conventional photolithographic techniques, a layer of photoresist is deposited across the film and defined into a mask which protects the film from further processing in areas where resistors are not desired. The exposed polycrystalline silicon then is implanted with silicon atoms to render the film amorphous. Although an amorphous film could have been deposited originally, generally in the fabrication of semiconductor devices, the properties of the originally deposited polycrystalline silicon film are desired in many regions on the die, and consequently a polycrystalline film is deposited and only those portions of the film where resistors are desired is implanted with silicon to become amorphous.

In my process the implant dose and energy of the silicon atoms is chosen to convert the entire film thickness to substantially amorphous silicon. To do so, the damage density, i.e., the product of the implant energy and implant density per unit depth, is made greater than a threshold value of $1 \times 10^{21}$ KeV per cubic centimeter throughout the depth of the polycrystalline film. Greater damage densities may be employed; however, the essential aspect of the step is that the grain boundaries throughout the full thickness of the film be destroyed so that the film is substantially amorphous. In my preferred embodiment I employ three separate implant steps, each with a dose of $1 \times 10^{15}$ silicon atoms per square centimeter. The implant energy for the three steps is 40 KeV, 90 KeV, and finally 120 KeV. In the preferred embodiment this process achieves a threshold damage density of nearly $1 \times 10^{22}$ KeV per cubic centimeter throughout the depth of the polysilicon film. The damage density as a function of depth is shown graphically in FIG. 1. FIG. 2 is a graph showing the implanted silicon atom concentration as a function of depth in the polycrystalline layer. Further information regarding the implantation of polycrystalline silicon with silicon and the concept of threshold damage density is found in S. Prussin et al., "Formation of Amorphous Layers by Ion Implantation," *J. Appl. Phys.* (15 Jan. 1985) 57(2): 180–185.

Once the polycrystalline film has been rendered amorphous, it is implanted with an appropriate dopant. The desired dopant will be one which enhances the growth of grain structure, as opposed to retarding it. Arsenic, phosphorus, and boron are three suitable dopants, whereas oxygen, which is known to retard the growth of grain boundaries in polycrystalline films, generally is not suitable. In the preferred embodiment of my process, boron or phosphorus are implanted at an energy of 80 KeV and a dose of $1 \times 10^{15}$ ions per square centimeter. The parameters of the impurity doping are not crucial to my process. A range of energies from 40 to 200 KeV may be employed, with an impurity dose of between $1 \times 10^{14}$ and $5 \times 10^{15}$ atoms per square centimeter is employed. Other suitable impurities include arsenic. In my research thus far, the most promising results have been achieved with boron. Use of boron allows better control of sheet resistance and of the ultimate temperature coefficient. Boron also provides a zero temperature coefficient at a higher sheet resistance than do the other impurities.

Once the film is implanted with suitable dopants, a series of annealing processes are performed—in the preferred embodiment, three. First, the film is annealed at between 500° C. and 650° C. for a relatively long period, on the order of hours, in an inert ambient. In a preferred embodiment the amorphous film of silicon is annealed at 600° C. for 8 hours in nitrogen. During the long annealing, the grain structure will gradually reform within the amorphous silicon and return the film to a polycrystalline structure. I have found that the growth of the grain structure is best carried out at a relatively lower temperature, well less than 700° C., because the process is difficult to control at an elevated temperature due to the rapid formation of grains.

At the completion of the first annealing process, the film is further annealed at a high temperature, for example, 950° C., for a relatively short period, on the order of 30 minutes, to fully activate the dopants. During this annealing, the dopants are activated electrically, but little change in grain size occurs. Temperatures from 850° C. to 1000° C. for a period of 10 to 60 to 60 minutes are satisfactory.

Lastly, the film is annealed in a hydrogen ambient at a lower temperature, for example, 450° C. for 30 minutes. Annealing in hydrogen anneals the interface states at the grain boundaries and further improves the temperature coefficient. The hydrogen annealing is more effective with boron doped films than with phosphorus or arsenic doped films. Before annealing in hydrogen, the silicon crystal structure is disrupted at the grain boundaries, and the resulting broken bonds between silicon atoms trap charges which gives rise to a potential barrier at the grain boundaries. Annealing in hydrogen helps lower the barrier height because the silicon ions capture hydrogen ions and neutralize the charge at the grain boundaries, thereby lowering the barrier height. The annealing must be performed at a temperature on the order of 300° C. to 450° C. Above 450° C. the hydrogen escapes and will not link up with the silicon ions. A period of 15 to 300 minutes is sufficient. The time of the low temperature annealing and the hydrogen annealing steps may be varied with respect to each other to obtain the desired temperature coefficient because both steps tend to make the temperature coefficient more positive.

FIG. 3 is a graph illustrating the relationship of sheet resistance as a function of temperature for a polycrystalline silicon layer implanted with silicon and boron. The relationship is shown for each of three different stages of the annealing process. For the curves depicted in FIG. 3, the slope is indicative of the temperature coefficient. For example, for the upper curve, the temperature coefficient is clearly negative as sheet resistance declines with increasing temperature. By the completion of the process, however, as reflected by the lower curve, the temperature coefficient is zero or slightly positive.

EXAMPLES

In one experiment 3500 Angstroms of polycrystalline silicon were deposited using chemical vapor deposition onto a silicon dioxide layer on a silicon wafer. In a first experiment phosphorus was then implanted at a dose of $1 \times 10^{15}$ atoms per square centimeter at an energy of 80 KeV. The structure was then annealed at 600° C. for 8 hours in nitrogen, annealed at 950° C. for 15 minutes in nitrogen (to enable measurement of sheet resistance), then annealed at 950° C. for 30 minutes in nitrogen, and finally annealed at 450° C. for 30 minutes in a hydrogen ambient. After each of the last three annealing steps, the sheet resistance was measured in ohms per square at a variety of temperatures ranging from approximately 20° C. to 170° C. The temperature coefficient then was calculated. The resulting data are set forth in the table below.

In a second experiment boron was employed in place of phosphorus, and the same annealing steps were performed. The results of this experiment are set forth in the table below.

In a third experiment, the polycrystalline silicon film was rendered amorphous by implanting $1 \times 10^{15}$ silicon atoms per square centimeter at 40 KeV, 90 KeV, and 120 KeV, all prior to the introduction of impurity. The sheet resistance and temperature coefficients were determined following each of the last three annealing steps. The results are set forth in the table below. Finally, in a fourth experiment, boron was employed in place of phosphorus, with the results also set forth below. As shown in the table, in the fourth experiment following the three annealing steps, the resulting film had a positive temperature coefficient.

TABLE 1

| Implant Species | Step | Sheet Rest. ($\Omega$/sq.) | Temp. Coef. (%/C) |
|---|---|---|---|
| 1st Experiment: | | | |
| Phosphorus | a. | 709 | −.165 |
| | b. | 1380 | −.172 |
| | c. | 1310 | −.168 |
| 2nd Experiment: | | | |
| Boron | a. | 1370 | −.129 |
| | b. | 861 | −.0897 |
| | c. | 754 | −.0842 |
| 3rd Experiment: | | | |
| Silicon and | a. | 424 | −.129 |
| Phosphorus | b. | 873 | −.142 |
| | c. | 810 | −.298 |
| 4th Experiment: | | | |
| Silicon | a. | 763 | −.0924 |
| and Boron | b. | 433 | −.0339 |
| | c. | 395 | +.0127 | a. After 950° C. for 15 minutes.
b. After a and 950° C. for 30 minutes.
c. After b and 450° C. for 30 minutes in hydrogen.

The preceding has been a description of the process of my invention in which specific times, temperatures, dosages, and impurities have been set forth. These details should be understood as explaining the invention, but should not be viewed as limiting it. For example, those skilled in the art will appreciate that the polycrystalline film may be deposited with the desired impurity already present. The scope of the invention may be ascertained from the appended claims.

I claim:

1. A method of fabricating polycrystalline silicon resistors having substantially zero or positive temperature coefficient of resistance on semiconductor structures comprising:
    depositing polycrystalline silicon on the semiconductor structure;
    implanting the polycrystalline silicon to make it substantially amorphous silicon;
    introducing at least one impurity into the amorphous silicon; and
    annealing the amorphous silicon.

2. A method as in claim 1 wherein the step of implanting comprises implanting with silicon.

3. A method as in claim 2 wherein the step of implanting comprises implanting with an implant having a damage density greater than $1 \times 10^{21}$ KeV per cubic centimeter throughout the polycrystalline silicon.

4. A method as in claim 3 wherein the step of implanting comprises implanting with a dose of $1 \times 10^{15}$ silicon atoms per square centimeter and an energy of 40 KeV, then 90 KeV and then 120 KeV.

5. A method as in claim 1 wherein the step of introducing comprises introducing about $1 \times 10^{15}$ ions per square centimeter.

6. A method as in claim 5 wherein the ions are introduced with an energy of about 80 KeV.

7. A method as in claim 1 wherein the step of introducing comprises doping the amorphous silicon with boron.

8. A method as in claim 1 wherein the wherein the step of introducing comprises doping the amorphous silicon with phosphorus.

9. A method as in claim 1 wherein the step of annealing comprises first annealing at between 500° C. and 650° C.

10. A method as in claim 9 wherein the step of annealing further comprises the annealing at between 850° C. and 1000° C.

11. A method as in claim 10 wherein the step of annealing further comprises annealing at between 300° C. and about 450° C.

12. A method as in claim 1 wherein the step of annealing comprises annealing at about 600° C. in nitrogen, then at about 950° C. in nitrogen, and then at about 450° C. in hydrogen.

13. A method as in claim 12 wherein the annealing at about 600° C., at about 950° C. and about 450° C. is performed for about 8 hours, about 30 minutes and about 30 minutes, respectively.

14. A method as in claim 1 wherein following the step of depositing a step is performed comprising defining a mask over the polycrystalline silicon which mask includes openings where the polycrystalline silicon regions are desired.

15. A method of fabricating a polycrystalline silicon resistor having substantially zero or positive temperature coefficient of resistance comprising:
    depositing a layer of polycrystalline silicon on an insulating substrate;
    implanting the layer with silicon to render the layer substantially amorphous;
    doping the layer with boron;
    annealing the layer at a first temperature in an inert ambient;
    further annealing the layer in an inert ambient at a second temperature higher than the first temperature; and
    again annealing the layer in a hydrogen atmosphere.

* * * * *